(12) United States Patent
Wang et al.

(10) Patent No.: US 6,417,522 B1
(45) Date of Patent: Jul. 9, 2002

(54) LED WITH ALTERNATED STRAIN LAYER

(75) Inventors: Wang Nang Wang, Bath (GB); Stephen Sen-Tien Lee, Taipei (TW)

(73) Assignee: Arima Optoelectronics Corporation, Taipei (TW)

( * ) Notice: Subject to any disclaimer, the term of this patent is extended or adjusted under 35 U.S.C. 154(b) by 0 days.

(21) Appl. No.: 09/451,357

(22) Filed: Dec. 2, 1999

(30) Foreign Application Priority Data

Dec. 2, 1998 (GB) .............................. 9826516

(51) Int. Cl.$^7$ .............................. H01L 27/15

(52) U.S. Cl. .......................... 257/79; 257/103
(58) Field of Search ...................... 257/12, 13, 79, 257/86, 103, 190

(56) References Cited

U.S. PATENT DOCUMENTS

| | | | |
|---|---|---|---|
| 5,319,660 A | 6/1994 | Chen et al. | 372/45 |
| 5,502,739 A | 3/1996 | Kidoguchi et ak. | 372/45 |
| 5,555,271 A | 9/1996 | Honda et al. | 372/45 |
| 5,559,818 A | 9/1996 | Shono et al. | 372/45 |
| 5,600,667 A | 2/1997 | Kidoguchi et al. | 372/45 |
| 5,784,399 A | * 7/1998 | Sun | 372/50 |
| 6,057,563 A | * 5/2000 | Chen et al. | 257/97 |

FOREIGN PATENT DOCUMENTS

| | | |
|---|---|---|
| EP | 0 518 320 | 12/1992 |
| EP | 0 557 638 | 9/1993 |

OTHER PUBLICATIONS

Copy of Search Report dated Mar. 17, 1999 for corresponding United Kingdom Application No. GB 9826516.8.

* cited by examiner

*Primary Examiner*—Mark V. Prenty
(74) *Attorney, Agent, or Firm*—Christie, Parker & Hale, LLP

(57) ABSTRACT

The present invention relates to light omitting diodes having an AlGaInP active layer disposed between two cladding layers of AlGaInP, with a strain layer grown on the second cladding layer and comprising a superlattice structure in the form of a plurality of thin alternated AlGaInP layers with preselected composition. In one embodiment, the composition of the alternated AlGaInP layers is an ohmic n-electrode on a rear surface of a GaAs substrate: a distributed AlGaAs Bragg reflecting layer in the form of a multi-layer lamination; a first, lower AlGaInP cladding layer grown on the reflecting layer; an AlGaInP active layer grown on the lower cladding layer; a second, upper AlGaInP cladding layer grown on the active layer; a strain layer grown on the second cladding layer, the strain layer comprising a superlattice structure in the form of a plurality of thin alternated AlGaInP layers with the composition: $(Al_xGa_{1-x})_{1-y}In_yP/(Al_nGa_{1-n})_{1-n}In_nP$, where $0.5 \leq x \leq 1$; $0.4 \leq y \leq 0.6 / 0 \leq a \leq 0.4$; $0 \leq b \leq 0.4$.

5 Claims, 1 Drawing Sheet

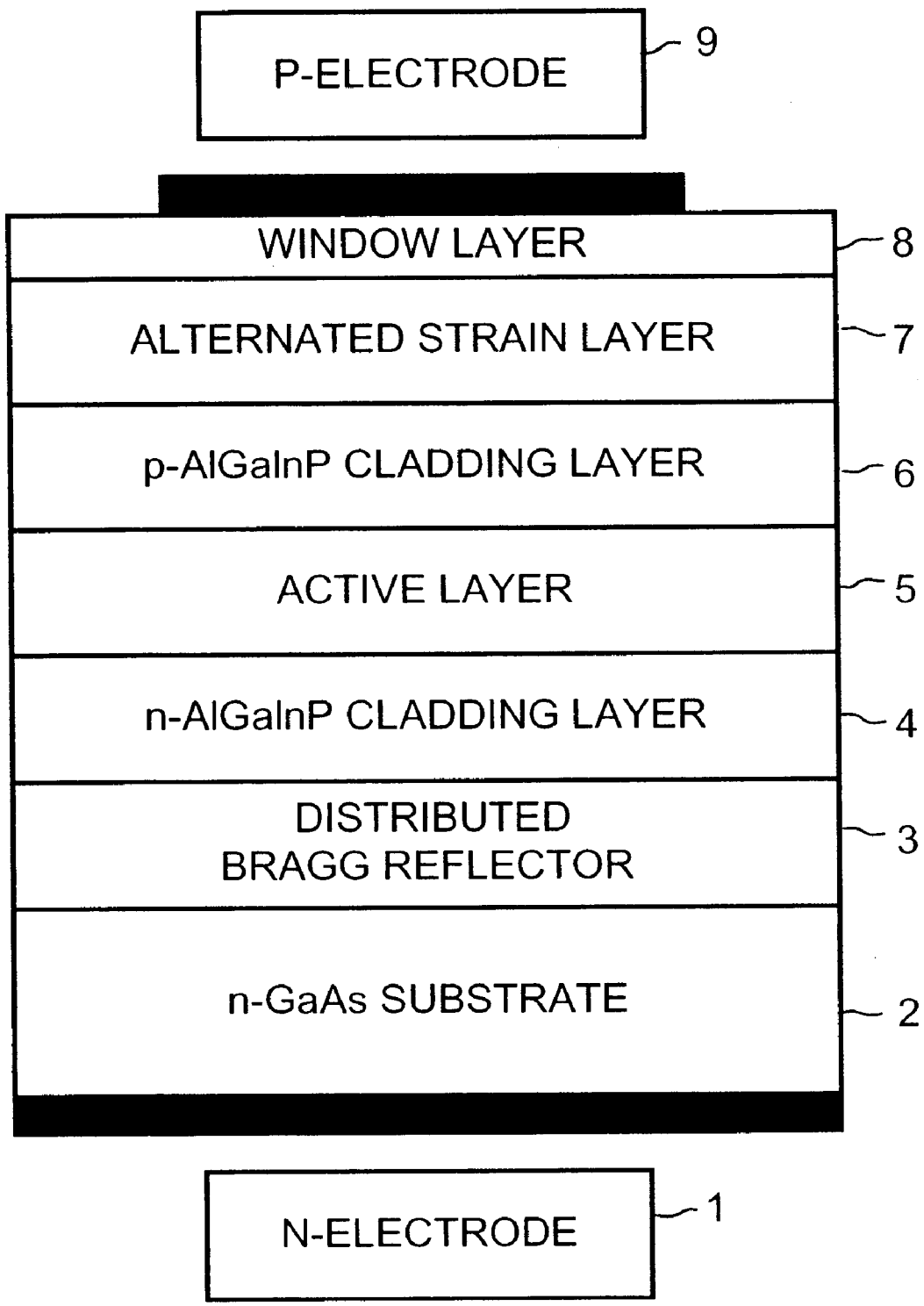

LED WITH ALTERNATED STRAIN LAYER

BACKGROUND OF THE INVENTION

The present invention relates to light-emitting diodes (LEDs).

SUMMARY OF THE INVENTION

The present invention relates to light omitting diodes having an AlGaInP active layer disposed between two cladding layers of AlGaInP, with a strain layer grown on the second cladding layer and comprising a superlattice structure in the form of a plurality of thin alternated AlGaInP layers with preselected composition. In one embodiment, the composition of the alternated AlGaInP layers is an ohmic n-electrode on a rear surface of a GaAs substrate; a distributed AlGaAs Bragg reflecting layer in the form of a multi-layer lamination; a first, lower AlGaInP cladding layer grown on the reflecting layer; an AlGaInP active layer grown on the lower cladding layer; a second, upper AlGaInP cladding layer grown on the active layer; a strain layer grown on the second cladding layer, the strain layer comprising a superlattice structure in the form of a plurality of thin alternated AlGaInP layers with the composition: $(Al_xGa_{1-x})_{1-y}In_yP/(Al_aGa_{1-a})_{1-b}In_bP$, wherein $0.5 \leq x \leq 1$; $0.4 \leq y \leq 0.6 / 0 \leq a \leq 0.4$; $0 \leq b \leq 0.4$.

BRIEF DESCRIPTION OF THE DRAWINGS

In the drawing, which constitutes a part of the specification, an exemplary embodiment exhibiting various objectives and features hereof is set forth. Specifically, the FIGURE constitutes a somewhat diagrammatic view of a light omitting diode constructed according to one embodiment of the present invention, shown in elevation.

According to the present invention, there is provided a LED having an alternated AlGaInP strain layer.

The present invention will now be described, by way of example, with reference to the accompanying drawing, which is a section through an example of an LED according to the invention.

DESCRIPTION OF THE PREFERRED EMBODIMENTS

Referring to the drawing, a light-emitting diode comprises: an ohmic n-electrode 1 on a rear surface of a GaAs substrate 2; a distributed AlGaAs Bragg reflecting layer 3 to improve the luminous efficiency (the Bragg reflector layer being in the form of a multi-layer lamination); a first, lower AlGaInP cladding layer 4 grown on the layer 3; an AlGaInP active layer 5 grown on the layer 4; a second, upper AlGaInP cladding layer 6 grown on the layer 5; an AlGaInP alternated strain layer 7 grown on the layer 6; a window layer 8 grown on the layer 7; and an ohmic p-electrode on the layer 8.

A double hetero-junction or multi-quantum well structure could replace active layer 5.

The alternated strain layer 7 is a structure consisting of thin alternated mismatched multi-layers. Also this structure can be described as a strain layer superlattices structure (SLS). It uses different compositions of $(Al_xGa_{1-x})_{1-y}In_yP$ thin layers as dislocation traps to reduce the induced defect density from upper cladding layer 6 changing to window layer 8. Also it is useful for modifying the band structure from high band gap upper cladding layer 6 to low band gap window layer 8 by changing the periodicity of $(Al_xGa_{1-x})_{1-y}In_yP$ thin layers, so the forward voltage becomes smaller and more stable.

Compositions of a typical example are set out below.

1. Distributed Bragg layer 3

$$Al_xGa_{1-x}As/Al_yGa_{1-y}As$$

where $0 \leq x \leq 1$; $0 \leq y \leq 1$; $x \neq y$

2. Cladding layers 4 and 6

$$(Al_xGa_{1-x})_{1-y}In_yP$$

where $0.5 \leq x \leq 1$; $0.4 \leq y \leq 0.6$
Thickness $0.5 \ \mu m \leq D \leq 1.5 \ \mu m$ 3. Alternated (superlattice structure) strain layer 7

$$(Al_xGa_{1-x})_{1-y}In_yP/(Al_aGa_{1-a})_{1-b}In_bP$$

where $0.5 \leq x \leq 1$; $0.4 \leq y \leq 0.6 / 0 \leq a \leq 0.4$; $0 \leq b \leq 0.4$
Thickness $D \leq 20$ nm 4. Multi-quantum well $$(Al_{x1}Ga_{1-x1})_{1-y1}In_{y1}P/(Al_{x2}Ga_{1-x2})_{1-y2}In_{y2}P$$

where $0.5 \leq x1 \leq 1$; $0.4 \leq y1 \leq 0.6 / 0 \leq x2 \leq 0.4$; $0 \leq y2 \leq 0.4$
Thickness $D \leq 20$ nm 5. Window layer 8

$$Ga_xIn_{1-x}P$$

where $0.9 \leq x \leq 1$
Thickness $5 \ \mu m \leq D \leq 15 \ \mu m$

What is claimed is:

1. A light emitting diode comprising:
   an ohmic n-electrode on a rear surface of a GaAs substrate;
   a distributed AlGaAs Bragg reflecting layer in the form of a multi-layer lamination;
   a first, lower AlGaInP cladding layer grown on the reflecting layer;
   an AlGaInP active layer grown on the lower cladding layer;
   a second, upper AlGaInP cladding layer grown on the active layer;
   a strain layer grown on the second cladding layer, the strain layer comprising a superlattice structure in the form of a plurality of thin alternated AlGaInP layers with the composition;

$$(Al_xGa_{1-x})_{1-y}In_yP/(Al_aGa_{1-a})_{1-b}In_bP$$

where $0.5 \leq x \leq 1$; $0.4 \leq y \leq 0.6 / 0 \leq a \leq 0.4$; $0 \leq b \leq 0.4$;
   a window layer grown on the strain layer; and
   an ohmic p-electrode on the window layer.

2. A light-emitting diode according to claim 1, wherein the distributed Bragg layer has the composition:

$$Al_xGa_{1-x}As/Al_yGa_{1-y}As$$

where $0 \leq x \leq 1$; $0 \leq y \leq 1$; $x \neq y$.

3. A light-emitting diode according to claim 1, wherein each of the cladding layers has the composition:

$$(Al_xGa_{1-x})_{1-y}In_yP$$

where $0.5 \leq x \leq 1$; $0.4 \leq y \leq 0.6$.

4. A light-emitting diode according to claim 1, wherein the active layer has the composition:

$$(Al_{x1}Ga_{1-x1})_{1-y1}In_{y1}P/(Al_{x2}Ga_{1-x2})_{1-y2}In_{y2}P$$

where $0.5 \leq x1 \leq 1$; $0.4 \leq y1 \leq 0.6/0 \leq x2 \leq 0.4$; $0 \leq y2 \leq 0.4$.

5. A light-emitting diode according to claim 1, wherein the window layer has the composition $$Ga_xIn_{1-x}P$$

where $0.9 \leq x \leq 1$.

\* \* \* \* \*